US011776757B1

(12) United States Patent
Moodie et al.

(10) Patent No.: US 11,776,757 B1
(45) Date of Patent: Oct. 3, 2023

(54) METHOD FOR MOUNTING HIGH VOLTAGE CAPACITOR BANKS

(71) Applicant: Smart Wires Inc., Union City, CA (US)

(72) Inventors: Andrew Moodie, Union City, CA (US); Amrit Iyer, Oakland, CA (US); Shreesha Adiga Manoor, Milpitas, CA (US); Antonio Ginart, Santa Clarita, CA (US); Joseph Innis Carrow, Oakland, CA (US); Ali Farahani, Yorba Linda, CA (US)

(73) Assignee: Smart Wires Inc., Durham, NC (US)

( * ) Notice: Subject to any disclaimer, the term of this patent is extended or adjusted under 35 U.S.C. 154(b) by 131 days.

(21) Appl. No.: 17/069,603

(22) Filed: Oct. 13, 2020

Related U.S. Application Data

(60) Provisional application No. 62/938,125, filed on Nov. 20, 2019.

(51) Int. Cl.
| | | |
|---|---|---|
| *H01G 4/38* | (2006.01) | |
| *H01G 4/258* | (2006.01) | |
| *H05K 7/20* | (2006.01) | |
| *H02J 7/34* | (2006.01) | |
| *H02J 3/18* | (2006.01) | |

(52) U.S. Cl.
CPC ............... *H01G 4/38* (2013.01); *H01G 4/258* (2013.01); *H02J 3/18* (2013.01); *H02J 7/345* (2013.01); *H05K 7/20009* (2013.01); *H05K 7/20509* (2013.01); *H02J 2207/50* (2020.01)

(58) Field of Classification Search
CPC .................................. H01G 11/10; H01G 4/38
See application file for complete search history.

(56) References Cited

U.S. PATENT DOCUMENTS

| | | | |
|---|---|---|---|
| 4,047,178 | A | 9/1977 | Czerwinski |
| 5,930,112 | A | 7/1999 | Babinski et al. |
| 5,934,381 | A | 8/1999 | Larsen |
| 6,181,200 | B1 | 1/2001 | Titizian et al. |
| 6,252,177 | B1 | 6/2001 | Stoddard |
| 6,331,931 | B1 | 12/2001 | Titizian et al. |
| 7,303,029 | B2 | 12/2007 | Hall et al. |
| 7,375,429 | B2 | 5/2008 | Teshima et al. |
| 7,656,177 | B2 | 2/2010 | Seki |
| 10,109,576 | B2 | 10/2018 | Tanaka |
| 2006/0065444 | A1 | 3/2006 | Hall et al. |
| 2006/0108607 | A1 | 5/2006 | Teshima et al. |
| 2008/0068801 | A1* | 3/2008 | Wilk ................. H01G 11/76 361/811 |
| 2008/0174318 | A1 | 7/2008 | Seki |

(Continued)

FOREIGN PATENT DOCUMENTS

| | | | |
|---|---|---|---|
| CN | 202758744 U | * | 2/2013 |
| CN | 203085373 U | * | 7/2013 |
| CN | 206611344 U | * | 11/2017 |

*Primary Examiner* — Eric W Thomas
(74) *Attorney, Agent, or Firm* — Womble Bond Dickinson (US) LLP

(57) ABSTRACT

A capacitor bank assembly has a conductive mount tray and capacitors. The capacitors are vertically mounted and held by the conductive mount tray. All positive terminals of the capacitors are connected to a first conductive plate. All negative terminals of the capacitors are connected to a second conductive plate. An insulating material separates the first conductive plate and the second conductive plate.

14 Claims, 3 Drawing Sheets

(56) References Cited

U.S. PATENT DOCUMENTS

| | | | |
|---|---|---|---|
| 2010/0089641 A1* | 4/2010 | Esmaili | H05K 7/1432 |
| | | | 174/70 B |
| 2010/0134974 A1* | 6/2010 | Nguyen | H01G 9/155 |
| | | | 361/689 |
| 2017/0163036 A1* | 6/2017 | Munguia | H05K 7/14 |
| 2018/0158772 A1 | 6/2018 | Tanaka | |

* cited by examiner

METHOD FOR MOUNTING HIGH VOLTAGE CAPACITOR BANKS

CROSS-REFERENCE TO RELATED APPLICATIONS

This application claims benefit of priority from U.S. Provisional Application No. 62/938,125 filed Nov. 20, 2019, which is hereby incorporated by reference.

TECHNICAL FIELD

This disclosure relates to a method for mounting power flow control devices, and in particular to a method for mounting components of an impedance injection unit of a power flow control system. The components include a plurality of capacitors in the form of a capacitor bank that implements a DC capacitor of an impedance injection unit, and a power switching assembly that is used to charge and discharge the DC capacitor.

BACKGROUND

Components of power flow control systems may be operated outdoors, and their mounting methods and cooling approaches preferably enable reliable operation across a wide range of operating and environmental conditions. Additionally, the orientation of certain components may be critical to withstanding vibration and shock. Therefore, there is a need in the art for improvements.

SUMMARY

One embodiment of a capacity bank assembly is for impedance injection into a power transmission line. The capacitor bank assembly has a conductive mount tray and capacitors. The capacitors are vertically mounted and held by the conductive mount tray. The capacitor bank assembly has a first conductive plate to which all positive terminals of the capacitors are connected. The capacitor bank assembly has a second conductive plate to which all negative terminals of the capacitors are connected. The capacitor bank assembly has an insulating material separating the first conductive plate and the second conductive plate.

One embodiment is a method for deploying a capacitor bank. The method includes providing a conductive mount tray holding capacitors. The method includes connecting a case of each capacitor to the conductive mount tray. The case is connected with a grounding stud to the conductive mount tray. The method includes connecting positive terminals of the capacitors to a first conductive plate. The method includes connecting negative terminals of the capacitors to a second plate. The method includes cooling the capacitor bank with convective air cooling.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

A capacitor bank is described as a component of an impedance injection unit; for example, the capacitor bank may support 1000 A injection at 600V, employing a total capacitance of around 10 mF. The impedance injection unit may be part of a power flow control system, wherein the capacitance bank stores energy for injection of a reactive impedance into a power transmission line. The capacitors of the capacitor bank and the high current drivers used to charge and discharge them are simultaneously strongly electrically coupled to one another, and weakly thermally coupled. The mounting method employs a vertical orientation of the capacitors, providing reduced stress on the capacitor terminals during vibration or shock.

A capacitor bank assembly (or capacitor bank) 10 described herein is referred to a subsystem or component of an impedance injection unit. For example, the capacitor bank assembly 10 may support 1000 A injection at 600V to employ a total capacitance of around 10 mF. In one embodiment, the capacitor bank assembly is configured to withstand sustained vibration of at least 3 g at 200 hertz and shock test of at least 80 g at 6 milliseconds. The impedance injection unit may be part of a power flow control system, where the capacitor bank assembly 10 stores energy for injection of a reactive impedance into a power transmission line. The switching assembly used for injecting the reactive impedance into a transmission line will be described in reference to FIG. 2.

In one embodiment, a capacitor mounting method employs a vertical orientation to provide reduced stress on the capacitor terminals, for example, during vibration or shock. During vertical accelerations that may occur during installation for example, and during operation, the terminals will be primarily in tensile or compressive stress, not shear stress. Accordingly, capacitor bank assembly 10 may withstand without damage a shock of 100 g at 6 ms, using IEC 60870-2-2 Class Dm testing method for example. Also, the capacitor bank assembly 10 may withstand sustained vibration at 4 g at 200 Hz, using this testing method. This reduced stress in the capacitor 11 terminals also reduces electron migration at high currents which can lead to contact failure.

Figure 1:
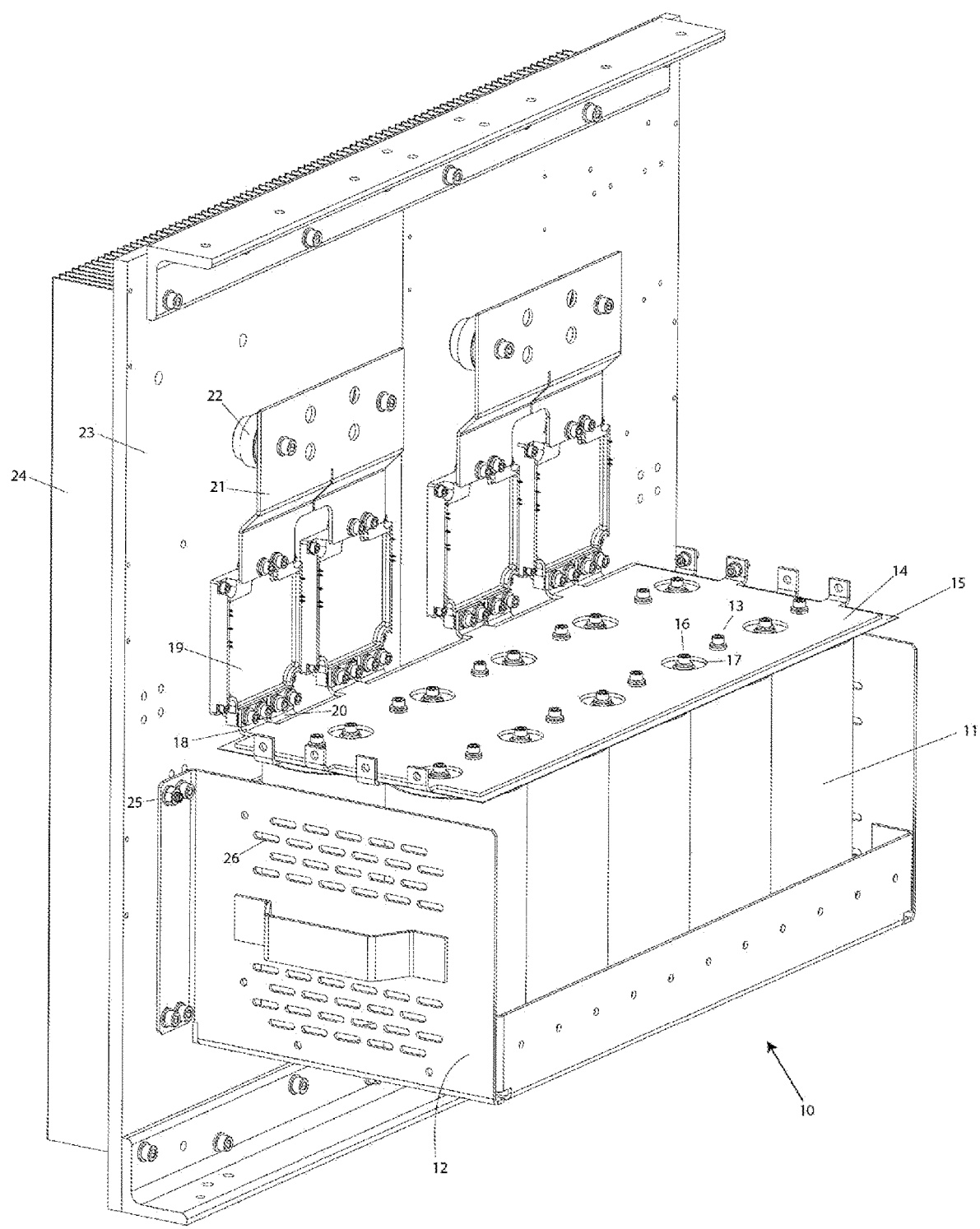
FIG. 1 is a perspective drawing of a mounted capacitor bank of the present invention, together with associated components of an impedance injection unit.

In FIG. 1, capacitors 11 of capacitor bank assembly 10 are vertically mounted, as shown, and held in a conductive mount tray 12. The case of each capacitor 11 is attached to the base of conductive mount tray 12 using a grounding stud (not shown). Conductive mount tray 12 may comprise a material such as stainless steel having a thermal conductivity of around 16 W/mK. This thermal conductivity is substantially less than that of aluminum (for example 6061 Al having a thermal conductivity of 167 W/mK), that may be used for cooling plate 23 and finned heat sink 24. Positive terminals 13 of capacitors 11 connect as shown to a positive plate 14. Negative terminals 16 of capacitors 11 connect to a negative plate, which is obscured in FIG. 1, by insulating sheet 15. Cut-outs 17 are provided as shown to prevent shorting of the positive and negative plates. Positive plate 14 includes a tab 18 that connects to IGBT (insulated gate bipolar transistor) module 19 of a power switching assembly to be further described in reference to FIG. 2. The negative plate has a tab 20 that also connects to IGBT module 19. A bus bar 21 is shown, attached to cooling plate 23 through an insulator 22. Cooling plate 23 is strongly thermally coupled to finned heat sink 24 which provides cooling to ambient air.

Slots 26 are shown in the sides of conductive mount tray 12 and are also provided in the tray base. Air flow over and through slots 26 provides convective cooling of capacitors 11 in conductive mount tray 12. The air flow may be increased using a fan. By effectively air cooling the conductive mount tray 12 and the capacitor bank assembly 10, its operating lifetime can be several years of operation in the field.

Capacitors 11 in capacitor bank assembly 10 may be separated by a sponge-like insulating material (not shown) which may allow for diameter variations due to manufacturing tolerances and due to varying operating temperatures. The sponge-like insulating material may comprise sponge rubber or foam rubber for example and may help to damp vibrations in capacitor bank assembly 10.

It can be seen in FIG. 1 that associated components of an impedance injection unit are integrated with a single wall of the impedance injection unit. The associated components include capacitor bank assembly 10 and IGBT modules such as 19. They are integrated in a manner that allows the operating temperatures of the IGBT modules and the capacitor bank assembly 10 to be substantially different. This can lead to an extended operating lifetime of the impedance injection unit.

Figure 2:
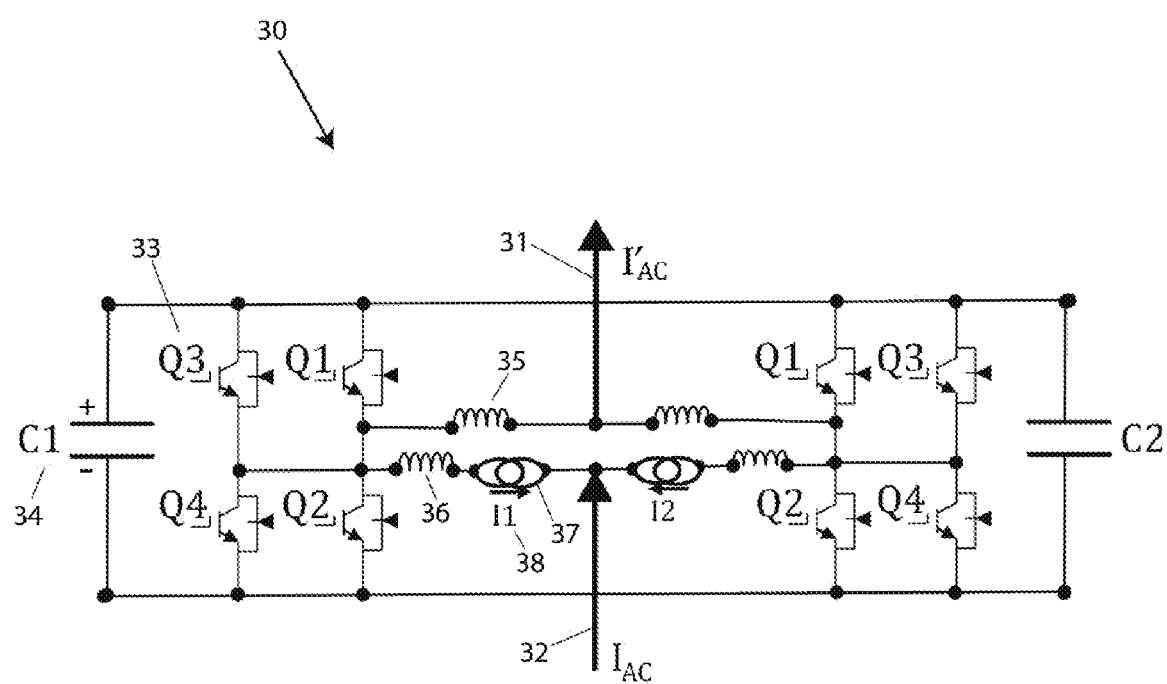
FIG. 2 is a schematic of a power switching assembly of an impedance injection unit.

FIG. 2 is a circuit diagram of a power switching assembly 30, which may be a component of an impedance injection unit. This diagram is used to show a close electrical coupling between high current drivers such as IGBTs Q1-Q4, and DC capacitor C1 34. In one embodiment, drivers are used to charge and discharge DC capacitor C1 34 and other capacitors in the capacitor bank assembly 10. The drivers may be closely spaced to the capacitors comprising DC capacitor C1 34, to minimize inductance between them. However, since the IGBTs operate at a high temperature, this can lead to a cooling problem if the drivers and capacitors are thermally coupled to the same cooling plate. Accordingly, it shall be described that the cooling plate 23 for cooling the IGBTs is thermally decoupled from the conductive mount tray 12 that holds the capacitors.

The circuit has two physically identical halves symmetrically arranged; for simplicity only one half will be described. Output 31 and input 32 to a power transmission line are shown. The power transmission line carries the line current, $I_{AC}$. DC capacitor 34 (C1) is shown with positive and negative terminals. The value of DC capacitor 34 may be around 0.1 mF as previously described, representing the total capacitance in capacitor bank assembly 10 of FIG. 1. Dual mode chokes (DMCs) 35 and 36 are shown. The positive terminal of DC capacitor 34 connects to terminals of IGBTs Q1 and Q3 as shown. The negative terminal of DC capacitor 34 connects to terminals of IGBTs Q2 and Q4 as shown. A current sensor 37 measures current 38 (Ii). The positive terminal of C1 34 connects via tab 18 to positive plate 14 of FIG. 1. Similarly, the negative terminal of C1 34 connects via tab 20 to the negative plate, which is separated from the positive plate 14 by a thin insulating sheet 15. The thin insulating sheet may comprise DuPont™ NOMEX® 410 meta-aramid polymer and may have a thickness of around 0.015 inches (or 0.38 mm). Further embodiments may have an insulating material that is a sheet having a thickness in a range of 0.005 to 0.060 inches.

Embodiments of the disclosure described herein provide strong electrical coupling of DC capacitor 34 to ICBT drivers such as Q1 and Q3 of FIG. 1, while providing only weak thermal coupling between cooling plate 23 to which the IGBT drivers are attached, and conductive mount tray 12 to which each capacitor in capacitor bank assembly 10 is thermally coupled, wherein the case of each capacitor is bolted to the mount tray using a grounding stud. This weak thermal coupling between cooling plate 23 and conductive mount tray 12 allows for a relatively high operating temperature of cooling plate 23 and the high current drivers, and simultaneously a relatively low operating temperature of conductive mount tray 12 and the capacitors.

Figure 3:
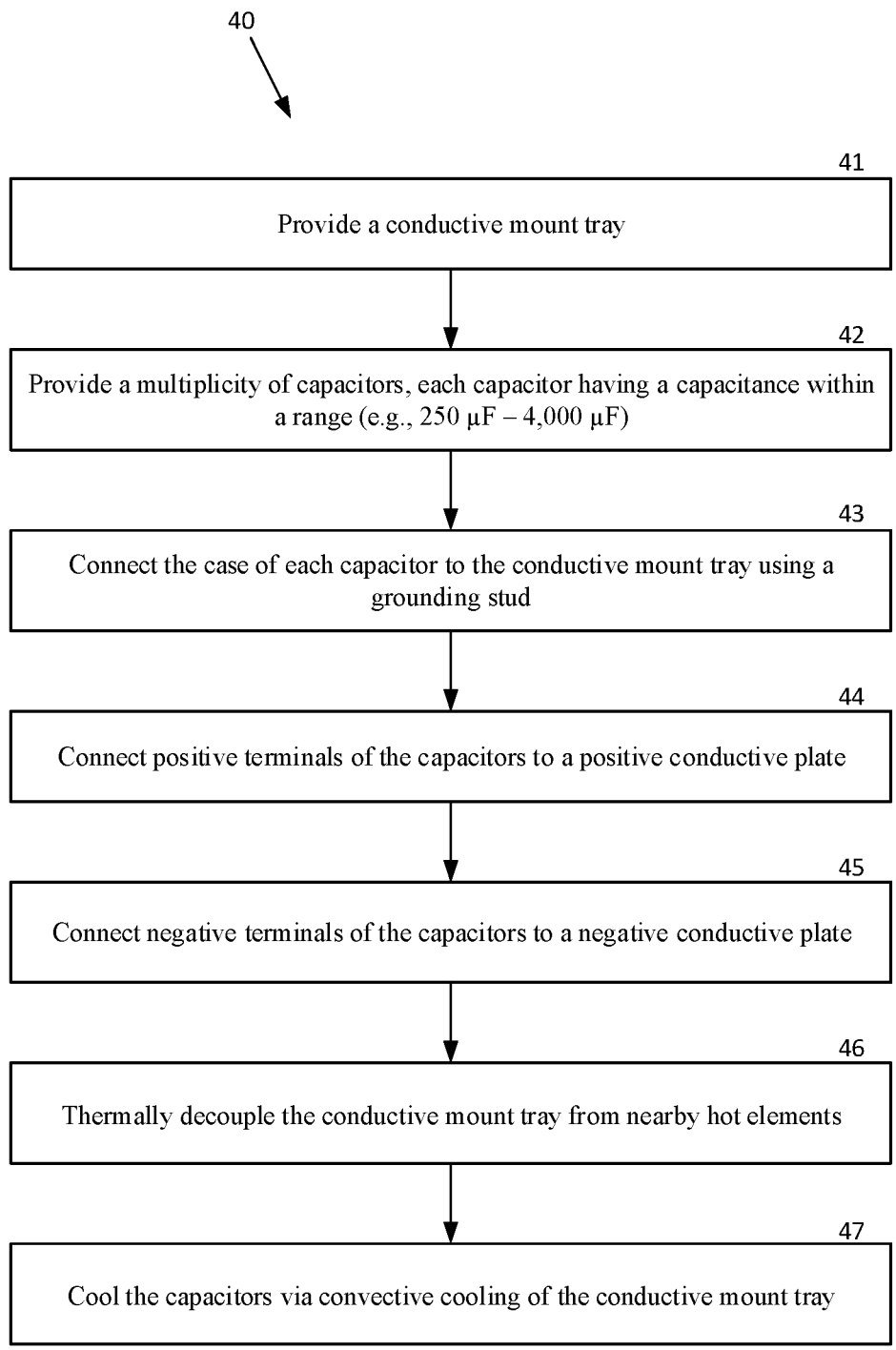
FIG. 3 is a flow chart of an exemplary method of the present invention, for deploying a capacitor bank having long life in an outdoors environment.

FIG. 3 is a flow chart of an example method for deploying a capacitor bank assembly (or capacitor bank) according to one embodiment. The first step of the method, step 41 is to provide a conductive mount tray. Step 42 is to provide a multiplicity of capacitors, with each capacitor having a capacitance within a range (e.g., 250 μF-4,000 μF). Step 43 is to connect the case of each capacitor to the conductive mount tray using a grounding stud. Step 44 connects the positive terminal of each capacitor to a first conductive plate, and step 45 connects the negative terminal of each capacitor to a second conductive plate. In step 46 the conductive mount tray is configured to be thermally decoupled from nearby hot elements (such as IGBT drivers of the power switching assembly) to the extent possible. Finally, in step 47 the capacitors in the capacitor bank assembly (e.g., capacitor bank assembly 10 of FIG. 1) are cooled by air flow around the conductive mount tray.

What is claimed is:

1. A capacitor bank assembly for impedance injection into a power transmission line, the capacitor bank assembly comprising:
   a conductive mount tray comprising convective cooling slots;
   a plurality of capacitors vertically mounted and held by the conductive mount tray;
   a first conductive plate to which all positive terminals of the plurality of capacitors are connected;
   a second conductive plate to which all negative terminals of the plurality of capacitors are connected;
   an insulating material separating the first conductive plate and the second conductive plate;
   a cooling plate thermally coupled to the conductive mount tray, wherein the conductive mount tray is mounted to the cooling plate; and
   a heat sink thermally coupled to the cooling plate to provide cooling to ambient air, wherein the cooling plate is attached to the heat sink;
   wherein the plurality of capacitors are cooled by convective air flow passing through the convective cooling slots and by conductive cooling from the conductive mount tray to the cooling plate;
   wherein the capacitor bank assembly is a subsystem or component of a transformerless impedance injection unit.

2. The capacitor bank assembly of claim 1, wherein the capacitor bank assembly is configured to withstand sustained vibration of at least 3 g at 200 hertz and shock test of at least 80 g at 6 milliseconds.

3. The capacitor bank assembly of claim 1, wherein:
   each of the plurality of capacitors has a case with a grounding stud connected to the conductive mount tray.

4. The capacitor bank assembly of claim 1, wherein the insulating material comprises a sheet having a thickness in a range of 0.005 to 0.060 inches.

5. The capacitor bank assembly of claim 1, wherein the insulating material comprises NOMEX® 410 meta-aramid polymer.

6. The capacitor bank assembly of claim 1, further comprising:
   a sponge-like material filling spaces between capacitors in the plurality of capacitors.

7. The capacitor bank assembly of claim 1, further comprising:
   a material comprising foam rubber filling spaces between capacitors in the plurality of capacitors.

8. The capacitor bank assembly of claim 1, further comprising:
   one or more high current drivers attached to and thermally coupled to the cooling plate;
   the one or more high current drivers electrically coupled to the plurality of capacitors to charge and discharge each of the plurality of capacitors;
   the plurality of capacitors being thermally coupled to the conductive mount tray; and
   the plurality of capacitors and the conductive mount tray being thermally coupled to, or thermally decoupled from, the one or more high current drivers and the cooling plate.

9. The capacitor bank assembly of claim 1, further comprising:
   one or more high current drivers, each high current driver comprising an insulated gate bipolar transistor (IGBT) to charge and discharge the plurality of capacitors.

10. The capacitor bank assembly of claim 1, wherein:
    the conductive mount tray includes a combination of air cooling and conductive cooling to cool the capacitor bank assembly.

11. The capacitor bank assembly of claim 1, further comprising:
    a power switching assembly;
    wherein the power switching assembly and the conductive mount tray, with the plurality of capacitors, the first conductive plate, the second conductive plate and the insulating material, are integrated with a single wall of the transformerless impedance injection unit.

12. The capacitor bank assembly of claim 1, wherein:
    the plurality of capacitors are operable to store energy for injection of a reactive impedance into the power transmission line for power flow control.

13. The capacitor bank assembly of claim 1, wherein a sum of capacitance for the plurality of capacitors is in a range of 0.1 to 10 mF (millifarads).

14. The capacitor bank assembly of claim 1, wherein each of the plurality of capacitors has a capacitance in a range of 250 to 4000 µF (microfarads).

* * * * *